(12) United States Patent
Yoo et al.

(10) Patent No.: US 9,935,176 B1
(45) Date of Patent: Apr. 3, 2018

(54) METHOD FOR FABRICATING LDMOS USING CMP TECHNOLOGY

(71) Applicant: Monolithic Power Systems Inc., San Jose, CA (US)

(72) Inventors: Ji-Hyoung Yoo, Los Gatos, CA (US); Zeqiang Yao, Santa Clara, CA (US); Deming Xiao, Los Altos Hills, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 15/356,516

(22) Filed: Nov. 18, 2016

(51) Int. Cl.
  *H01L 21/266* (2006.01)
  *H01L 29/66* (2006.01)
  *H01L 29/10* (2006.01)

(52) U.S. Cl.
  CPC ...... *H01L 29/66583* (2013.01); *H01L 21/266* (2013.01); *H01L 29/1095* (2013.01); *H01L 29/66681* (2013.01)

(58) Field of Classification Search
  CPC ........... H01L 29/1095; H01L 29/66681; H01L 21/266; H01L 21/26586
  See application file for complete search history.

(56) References Cited

U.S. PATENT DOCUMENTS

| | | | |
|---|---|---|---|
| 5,736,766 A * | 4/1998 | Efland | H01L 29/0696 257/338 |
| 6,252,278 B1 | 6/2001 | Hsing | |
| 6,518,138 B2 | 2/2003 | Hsing | |
| 8,546,879 B2 | 10/2013 | Disney et al. | |
| 9,159,795 B2 | 10/2015 | Yoo et al. | |
| 9,502,251 B1 | 11/2016 | McGregor et al. | |
| 2002/0100951 A1* | 8/2002 | Yasuhara | H01L 29/402 257/491 |
| 2013/0043534 A1* | 2/2013 | Disney | H01L 29/41766 257/336 |
| 2015/0084126 A1* | 3/2015 | Jung | H01L 21/26586 257/339 |

* cited by examiner

*Primary Examiner* — Anthony Ho
*Assistant Examiner* — Antonio Crite
(74) *Attorney, Agent, or Firm* — Perkins Coie LLP

(57) ABSTRACT

A method for fabricating a LDMOS device in a well region of a semiconductor substrate, including: etching a polysilicon layer above the well region through a window for a body region; and forming spacers at side walls of the polysilicon layer, to define positions of source regions in the well region.

13 Claims, 8 Drawing Sheets

METHOD FOR FABRICATING LDMOS USING CMP TECHNOLOGY

TECHNICAL FIELD

The present invention generally relates to semiconductor devices, and more particularly but not exclusively relates to methods for fabricating Laterally Diffused Metal Oxide Semiconductor (LDMOS) devices.

BACKGROUND

LDMOS (Lateral Diffused Metal Oxide Semiconductor) devices are widely used for high breakdown voltage, high current and good thermal performance in many applications including notebook, server, and DC/DC converter.

A LDMOS device comprises a well region 16, a drain pickup region 11, a source region 12, a gate 13, a body region 14, and a body pickup region 15 as shown in FIG. 1. Persons of ordinary skills in the art should know that the well region 16 is also referred as the drain drift region. For performance and cost reasons, many modern applications require smaller power devices in a smaller package. Much focus has been placed on drain engineering that includes RESURF (Reduced Surface Field), graded doped drain. Another area of focus is on making source region smaller. As shown in FIG. 1, a source/body region consists of the body pickup region 15 in the center and the source region 12 located on both sides of the body pickup region 15, which form an N+/P+/N+ region. Reducing the N+/P+/N+ region would result in a smaller source region. But usually the minimum area of the N+/P+/N+ is limited by the photo-masking equipment's capability.

SUMMARY

It is an object of the present invention to provide a process making reduced source region by using spacers and CMP technology to define the N+/P+/N+ source/body region instead of using a photo/masking step. The present invention also offers self-aligned source regions and body pickup region at one masking step. As a result, the present invention achieves reduced source regions of a LDMOS device and significant reduction of the cost for making LDMOS devices.

The embodiments of the present invention are directed to a method for fabricating a LDMOS device in a well region of a first doping type in a semiconductor substrate, comprising: forming a gate oxidation layer above the well region; forming a polysilicon layer above the gate oxidation layer; forming a block layer of material having a faster etching rate than the gate oxidation layer above the polysilicon layer; etching both the block layer and the polysilicon layer, through a window of a first masking layer to expose a window to the well region; implanting dopants of a second doping type into the well region under the window of the first masking layer to form a body region; forming spacers to wrap side walls of the polysilicon layer in a window of the polysilicon layer which is formed after etching; implanting dopants of the second doping type into the body region under a window shaped by the spacers to form a body pickup region; depositing polysilicon to the window shaped by the spacers to form a polysilicon block; performing chemical mechanical polishing to expose the spacers between the polysilicon block and the polysilicon layer; etching away the spacers and the block layer; implanting dopants of the first doping type into the body region under windows left after etching away the spacers to form source regions; etching away the polysilicon block; etching the polysilicon layer through windows of a second masking layer to form a gate; and implanting dopants of the first doping type into the well region under windows of a third masking layer to form drain pickup regions.

The embodiments of the present invention are also directed to a method for fabricating a LDMOS device, comprising: etching a polysilicon layer above a well region in a semiconductor substrate through a window for a body region; and forming spacers at side walls of the polysilicon layer in a window of the polysilicon layer which is formed after etching, to define positions of source regions in the body region.

The embodiments of the present invention are further directed to a manufacturing process of a LDMOS device, comprising: forming a well region in a semiconductor substrate; forming a gate oxidation layer above the well region; depositing a polysilicon layer above the gate oxidation layer; sequentially forming a gate seal layer, a silicon nitride layer and a first masking layer above the polysilicon layer, wherein the first masking layer comprises at least a window to the surface of the silicon nitride layer; etching the silicon nitride layer, the gate seal layer and the polysilicon layer under the window of the first masking layer to expose a window for a body region in the well region; implanting P type dopants into the well region under the window for the body region to form the body region in the well region, and removing the first masking layer later; oxidizing side walls of the polysilicon layer in a window of the polysilicon layer which is formed after etching; forming spacers at the oxidized side walls of the polysilicon layer; filling the window between the spacers with polysilicon to forming a polysilicon block; performing chemical mechanical polishing to expose the spacers between the polysilicon block and the side walls of the polysilicon layer; etching away the silicon nitride layer and the spacers to expose windows for source regions; implanting N type dopants into the well region under the windows for source regions to forming source region; etching away the polysilicon block; forming a second masking layer above the gate seal layer, wherein the second masking layer has windows at predetermined positions; etching the gate seal layer and the polysilicon layer through the windows of the second masking layer to form a gate, and removing the second masking layer later; forming a third masking layer above the gate and the gate oxidation layer, wherein the third masking layer comprises windows for drain pickup regions; and implanting N type dopants into the well region under the windows of the third masking layer to form the drain pickup regions, and removing the third masking layer later.

BRIEF DESCRIPTION OF THE DRAWINGS

The present invention can be further understood with reference to the following detailed description and the appended drawings, wherein like elements are provided with like reference numerals. The drawings are only for illustration purpose. They may only show part of the devices and are not necessarily drawn to scale.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

The terms "left," right," "in," "out," "front," "back," "up," "down, "top," "atop", "bottom," "over," "under," "beneath," "above," "below" and the like in the description and the claims, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein.

Figure 2:
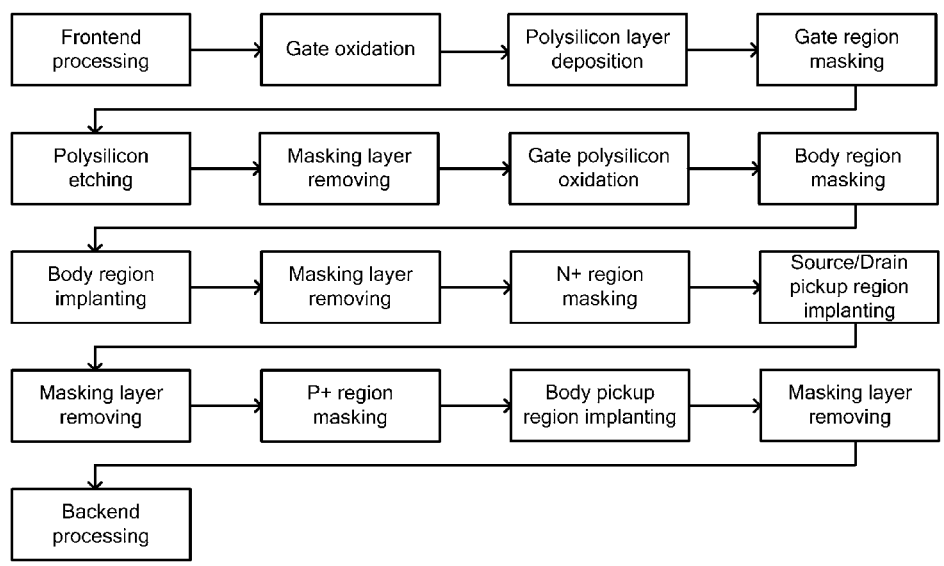
FIG. 2 shows a process flowchart outlining a prior art manufacturing process that could be used to fabricate the LDMOS device.

FIG. 2 shows a process flowchart outlining a prior art manufacturing process that could be used to fabricate a LDMOS device. The prior art manufacturing process may comprise steps of a frontend processing, gate oxidation, polysilicon layer deposition, gate region masking, polysilicon etching, masking layer removing, gate polysilicon oxidation, body region masking, body region implanting, masking layer removing, N+ region masking, source/drain region implanting, masking layer removing, P+ region masking, body pickup region implanting, masking layer removing and a backend processing. The frontend processing may comprise preparing an original substrate, forming N type buried layer (NBL), growing epitaxial layer (EPI), defining active areas. And in some applications, the frontend processing further comprises forming a thick gate oxidation layer. Backend processing may comprise forming electrodes for the source region, the drain region, the body pickup region and the gate, and then distributing metal layer. Persons of ordinary skill in the art should know that a masking step, e.g., gate region masking, means to form a masking layer with certain windows for determined areas on a top surface of a whole semiconductor substrate. For example, step of body region masking comprises forming a masking layer on the top surface of the whole semiconductor substrate, patterning the masking layer to form windows to the body regions in the semiconductor substrate. The masking layer may comprise a photoresist layer.

Figure 1:
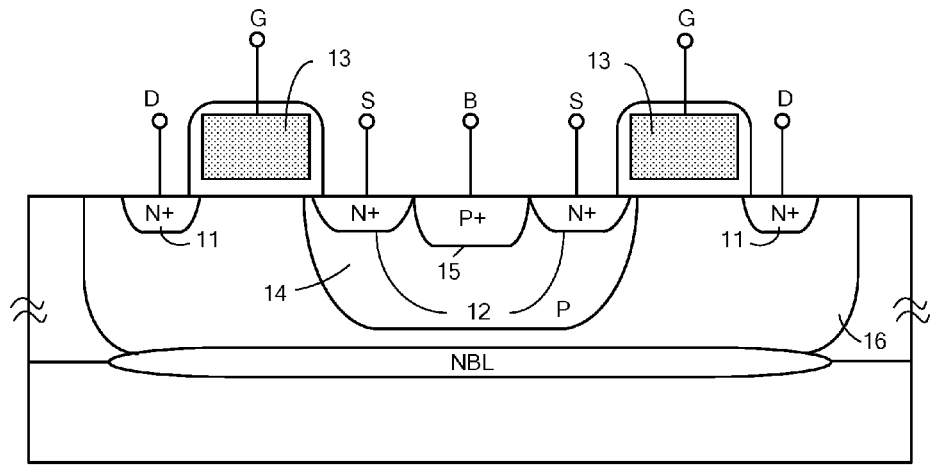
FIG. 1 shows a prior art LDMOS device.

As can be seen from FIG. 2, the body region, the body pickup region and the source/drain region are formed by traditional photo-masking and ion-implantation technique. As a result, a window for the source/body region, i.e., the N+/P+/N+ region in FIG. 1 would apparently limited by the photo-masking equipment's capability.

FIGS. 3a-j illustrate a process to fabricate a LDMOS device with smaller source in accordance with an embodiment of the present invention.

Figure 3A:
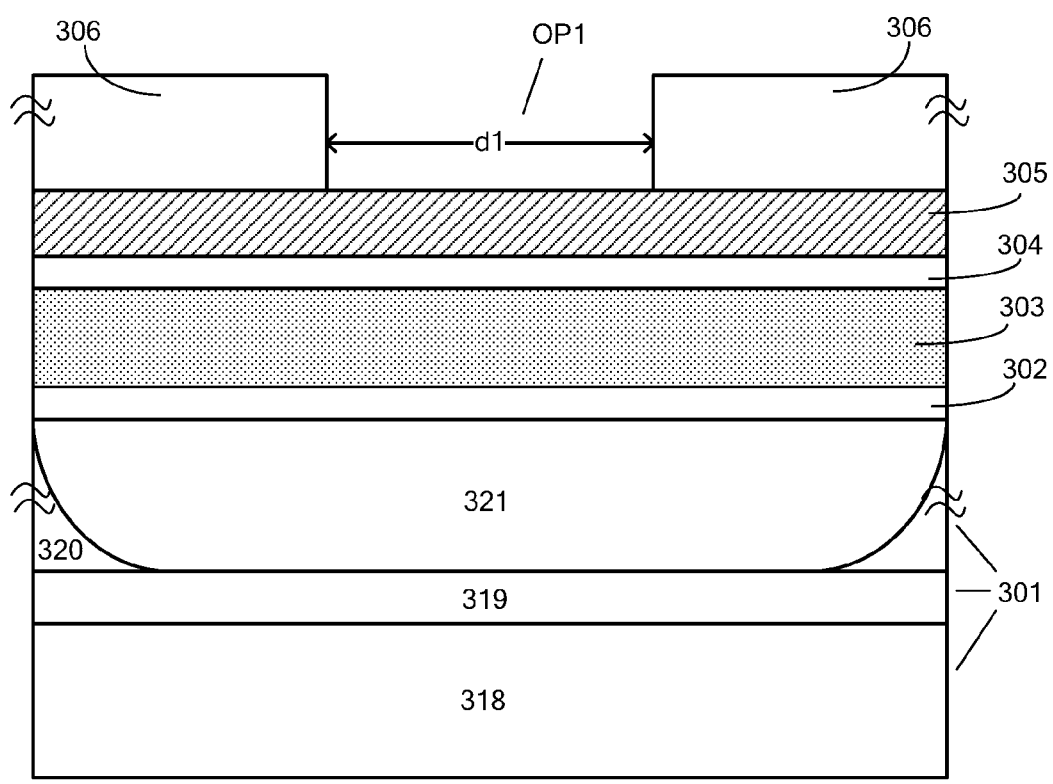
FIGS. 3a-j illustrate a process of fabricating the LDMOS device with small source in accordance with an embodiment of the present invention.

In FIG. 3a, a semiconductor substrate 301 is provided. The semiconductor substrate 301 comprises an original substrate 318, an N type Buried Layer (NBL) 319, an epitaxial layer 320 and a well region 321. The well region 321 is also referred as the drain drift region. The original substrate 318 may be N type, P type or intrinsic semiconductor material. The NBL 319 may be replaced with other structures. The epitaxial layer 320 may be N type, P type or intrinsic semiconductor material. The well region 321 may be a high voltage well with light doping concentration. The LDMOS device will be formed in the well region 321. The semiconductor substrate 301 may have other circuit(s)/device(s)/system(s) integrated in it. For example, in a BCD process, several devices, e.g., BJT (Bipolar Junction Transistor), CMOS (Complemented MOS devices), and so on would be integrated with LDMOS in a same substrate. In some embodiments, the semiconductor substrate may have other configuration or without some of the aforementioned regions. In FIG. 3a, a gate oxidation layer 302 is formed on a top surface of the semiconductor substrate 301. Next, on a top surface of the gate oxidation layer 302, polysilicon deposition is performed to form a polysilicon layer 303 which is later patterned as a gate of the LDMOS by etching via a masking layer. Then, an oxidation process or oxide deposition process is performed on a top surface of the polysilicon layer 303 to form a part of a gate seal layer 304. After that, a silicon nitride layer 305 is deposited on a top surface of the gate seal layer 304. Next, a masking layer 306 on a top surface of the silicon nitride layer 305 is formed by performing a lithographic process. The masking layer 306 comprises at least a window OP1 through to the top surface of the silicon nitride layer 305. The window OP1 is also referred as a source/body window and may be formed by dissolved a defined area in masking layer 306 after exposure to light. In one embodiment, a width d1 of the window OP1 may be in a range of 0.3 μm-0.5 μm.

The gate oxidation layer 302 is adopted as a dielectric layer and the polysilicon layer 303 is adopted as an electric conducting layer of the gate of the LDMOS device. Persons of ordinary skill in the art should know that the gate oxidation layer 302 and the polysilicon layer 303 may be replaced by other proper material.

In FIGS. 3b-j, the original substrate 318, the NBL 319 and the epitaxial layer 320 are not shown for clarity.

Figure 3B:
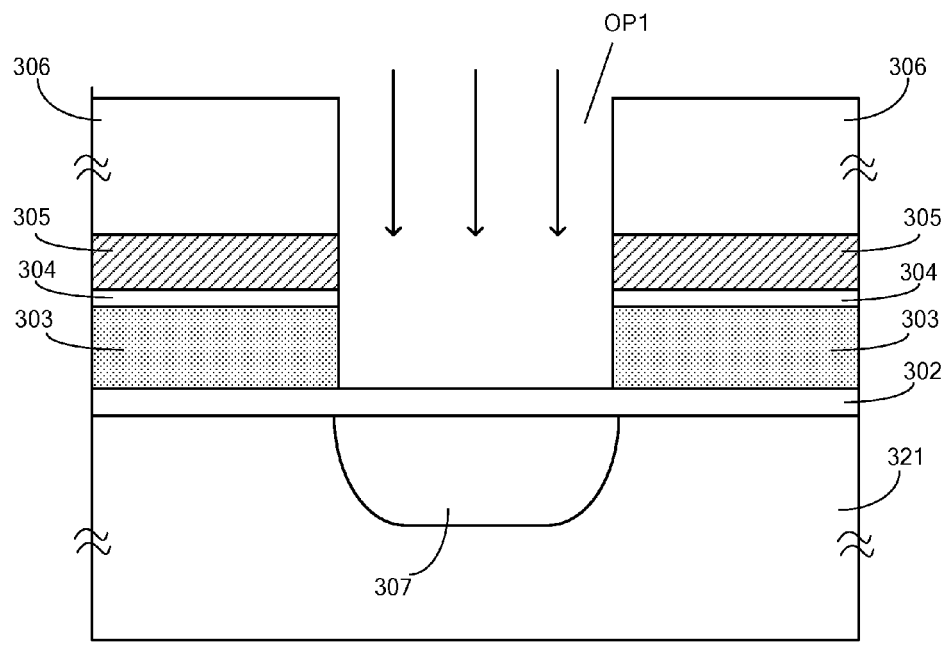

In FIG. 3b, the silicon nitride layer 305, the gate seal layer 304 and the polysilicon layer 303 are etched through the window OP1 to expose a surface of the well region 321 covered with gate oxidation layer 302 for a source/body region. After that, a body region 307 is formed by implanting P type dopants into the well region 321 under the window OP1. The masking layer 306 is striped after forming the body region 307.

Figure 3C:
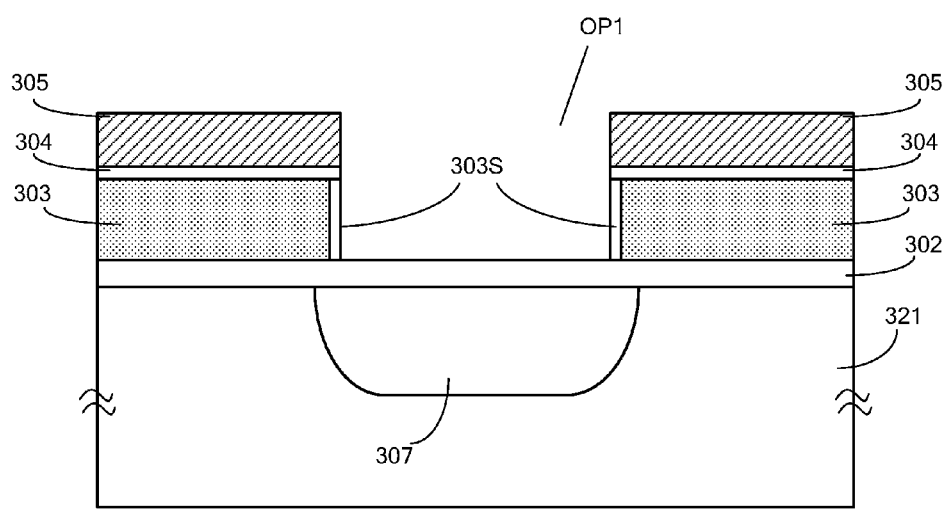

In FIG. 3c, an oxidation process is performed to form the side wall gate seal 303S to wrap the exposed side walls of the polysilicon layer 303 inside the window OP1. The side wall gate seal 303S constitutes part of the gate seal layer 304.

Figure 3D:
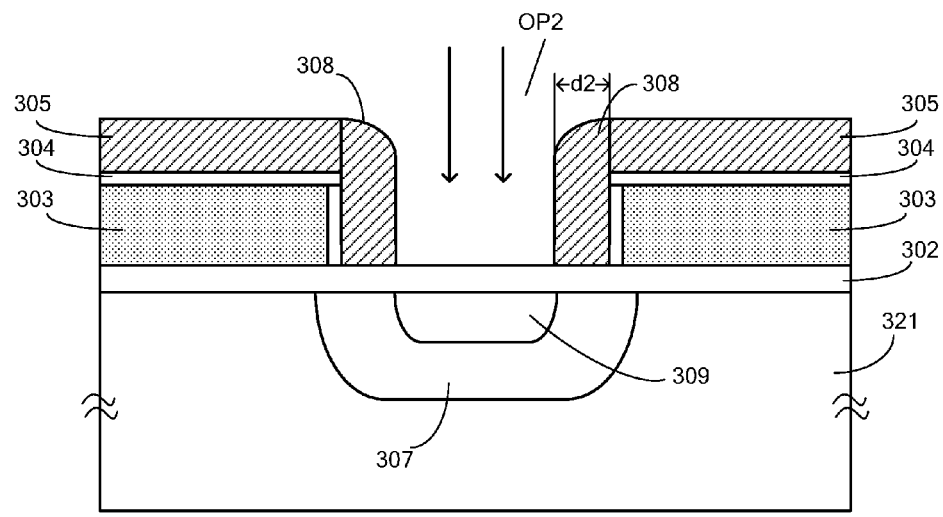

In FIG. 3d, silicon nitride (SiN) spacers 308 are formed to wrap the side gate seals 303S at the side walls of the polysilicon layer 303. The spacers 308 define positions of source regions in the body region 307. Furthermore, the spacers 308 shape a window OP2 for a body pickup region 309 in the body region 307, wherein the window OP2 is also referred as a body pickup region window. The silicon nitride layer 305 and the spacers 308 are adopted as a masking layer for P type dopants implanted into the body region 307 to form the body pickup region 309. The body pickup region 309 is implanted with high energy and has a higher doping concentration than the body region 307.

In the embodiment of FIG. 3d, because the silicon nitride layer 305 and the spacers 308 are adopted as a masking layer, an additional masking layer, e.g., a photoresist layer, for the body pickup region 309 is saved. The silicon nitride layer 305 is also referred as a block layer. In some embodiments, other material with faster etching rate than the gate oxidation layer 302 instead of silicon nitride may be adopted to form the block layer 305.

In one embodiment, the thickness d2 of each spacer 308 as shown in FIG. 3d is in a range of 0.1 μm~0.15 μm.

Figure 3E:
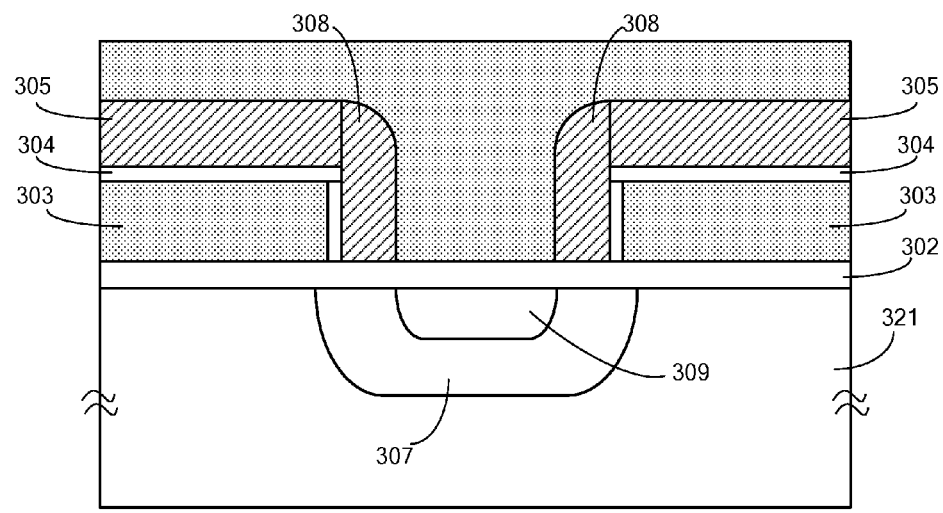

In FIG. 3e, polysilicon is deposited to the whole wafer where the LDMOS is located to fill the window OP2.

Figure 3F:
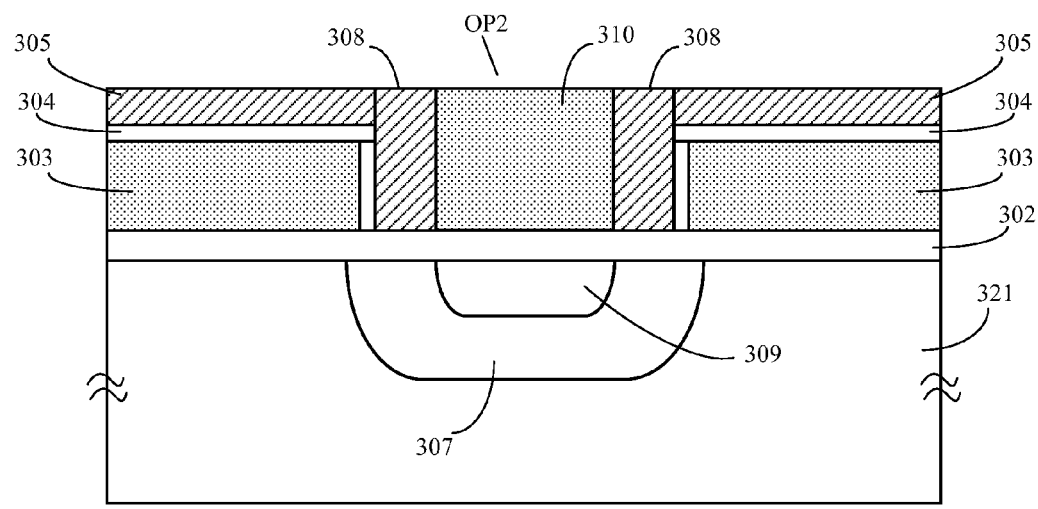

In FIG. 3f, chemical mechanical polishing (CMP) is performed. The silicon nitride layer 305 and the spacer 308 are adopted for CMP stop layer. After the CMP process, top of the spacer 308, the filled polysilicon, and the silicon nitride layer 305 are exposed. The polysilicon region filled in the window OP2 forms a polysilicon block 310 as shown in FIG. 3f.

Figure 3G:
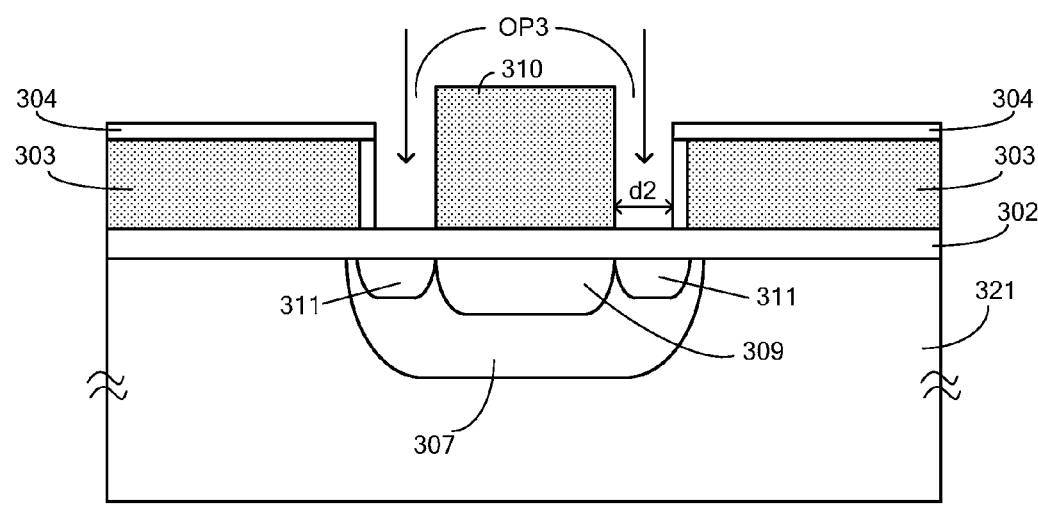

In FIG. 3g, the spacer 308 and the silicon nitride layer 305 are etched away to expose windows OP3 for source regions 311 inside the body region 307, wherein the windows OP3 are also referred as source windows. After that, the source regions 311 are formed by implanting N type dopants into the body region 307 through the windows OP3. In one embodiment, the windows OP3 may have a width d2 in a range of 0.1 μm~0.15 μm.

Figure 3H:
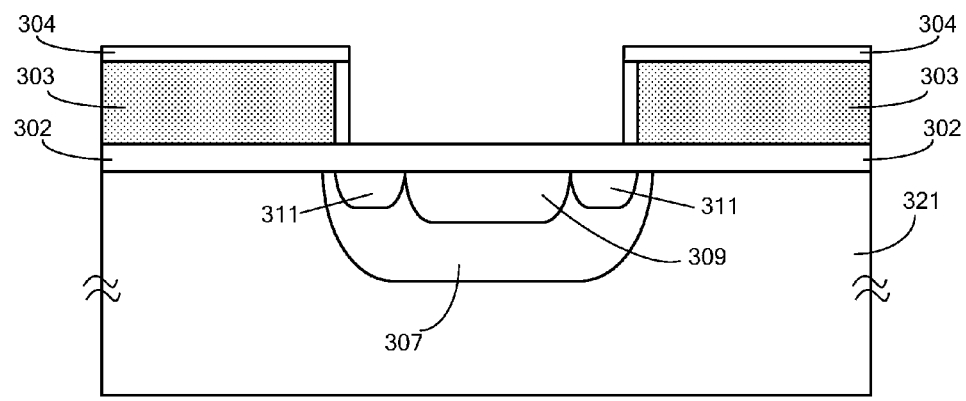

In FIG. 3h, the polysilicon block 310 is etched and the source/body region comprising the body region 307, the source region 311 and the body pickup region 309 is formed.

Figure 3I:
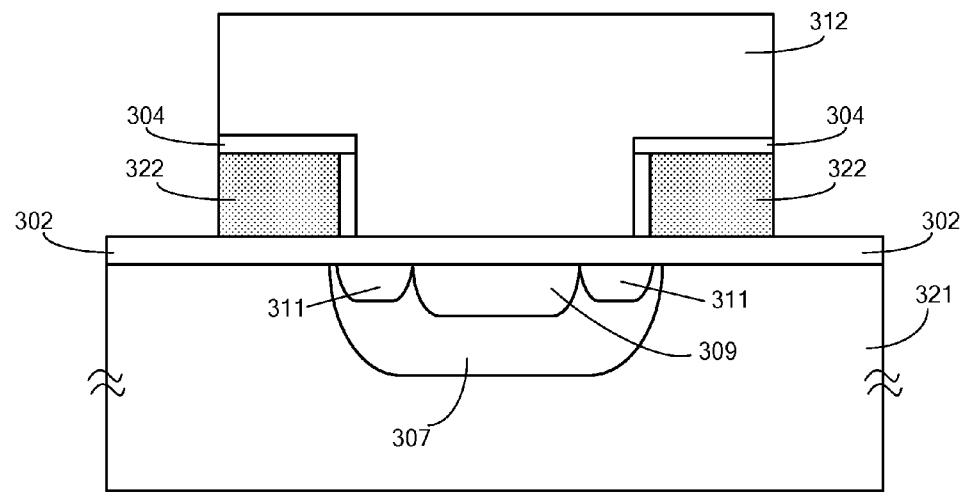

In FIG. 3i, a masking layer 312 is formed by performing the lithographic process. The masking layer 312 comprises positioned windows to pattern the gate. The polysilicon layer 303 is then etched to form a gate 322. The masking layer 312 is striped after forming the gate 322. An oxidation process may be performed to complete the gate seal layer 304.

Figure 3J:
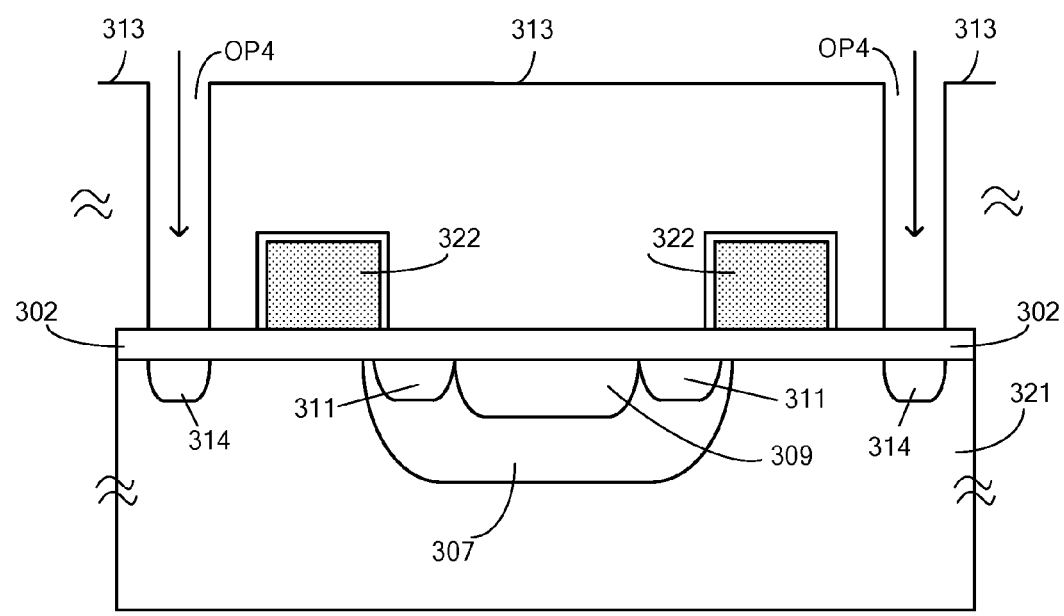

In FIG. 3j, a masking layer 313 is formed by performing the lithographic process. The masking layer 313 comprises positioned windows OP4 to define drain regions 314 of LDMOS device. The masking layer 313 is formed also for NMOS's N+ source and drain region, and other N+ layers like NPN bipolar transistor's emitter region and collector region. The drain pickup regions 314 are then formed by implanting N type dopants into the well region 321 through the window OP4. The masking layer 313 is striped after forming the drain pickup region 314.

Figure 4:
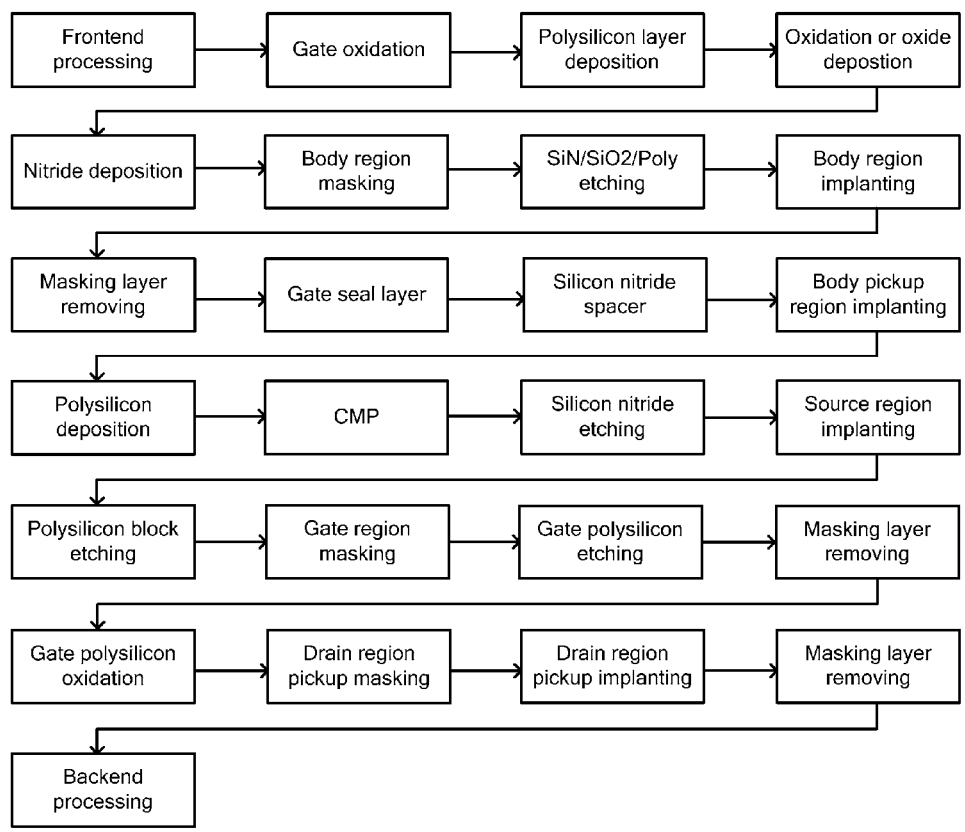
FIG. 4 shows a process flowchart outlining a manufacturing process that could be used to fabricate the LDMOS device of FIGS. 3a-j in accordance with an embodiment of the present invention.

FIG. 4 shows a process flowchart outlining a manufacturing process that could be used to fabricate the devices of FIGS. 3a-j in accordance with an embodiment of the present invention. Compared to prior art process shown in FIG. 2, spacers are formed at the side walls of the polysilicon layer in the window for the source/body region, to define positions of source regions in the well region. The thickness d2 of the spacer could be controlled in a range of 0.1 μm~0.15 μm, so that the width of the source region could be controlled in the range of 0.1 μm~0.15 μm, which is much narrower than the source region width of the prior art process made LDMOS device. The present invention adopts spacers and CMP technologies to define the very narrow N+/P+/N+ source/body region which cannot be achieved by conventional photo/masking equipment.

It should be known that the doping type for each region may be in an alternating type, for example, the N type regions may be replaced with P type regions while the P type regions may be replaced with N type regions. In one embodiment as claimed in the appended claims, the first doping type may be N type and the second doping type may be P type. And in another embodiment, the first doping type is P type and the second doping type is N type.

The N type doping substance can be selected from one of the following: nitrogen, phosphorus, arsenic, antimony, bismuth and the combination thereof, while the P type doping substance can be selected from one of the following: boron, aluminum, gallium, indium, thallium and the combination thereof.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A manufacturing process of a LDMOS device in a well region of a first doping type in a semiconductor substrate, comprising:
    forming a gate oxidation layer above the well region;
    forming a polysilicon layer above the gate oxidation layer;
    forming a block layer of material having a faster etching rate than the gate oxidation layer above the polysilicon layer;
    etching both the block layer and the polysilicon layer, through a window of a first masking layer to expose a window to the well region;
    implanting dopants of a second doping type into the well region under the window of the first masking layer to form a body region;
    forming spacers to wrap side walls of the polysilicon layer in a window of the polysilicon layer which is formed after etching;
    implanting dopants of the second doping type into the body region under a window shaped by the spacers to form a body pickup region;
    depositing polysilicon to the window shaped by the spacers to form a polysilicon block;
    performing chemical mechanical polishing to expose the spacers between the polysilicon block and the polysilicon layer;
    etching away the spacers and the block layer;
    implanting dopants of the first doping type into the body region under windows left after etching away the spacers to form source regions;
    etching away the polysilicon block;
    etching the polysilicon layer through windows of a second masking layer to form a gate; and implanting dopants of the first doping type into the well region under windows of a third masking layer to form drain pickup regions.

2. The manufacturing process of claim 1, wherein the spacers have a same etching rate with the block layer.

3. The manufacturing process of claim 1, wherein the spacers and the block layer are made of silicon nitride.

4. The manufacturing process of claim 1, further comprising forming a gate seal layer between the polysilicon layer and the block layer.

5. The manufacturing process of claim 1, wherein the side walls of the polysilicon layer in the window of the polysilicon layer is oxidized before forming the spacers.

6. The manufacturing process of claim 1, wherein the thickness of each spacer at the side wall of the polysilicon layer is in a range of 0.1 μm~0.15 μm.

7. The manufacturing process of claim 1, wherein the width of the body region is in a range of 0.3 μm~0.5 μm.

8. A method for fabricating a LDMOS device, comprising:
   etching a polysilicon layer above a well region in a semiconductor substrate through a window for a body region;
   forming spacers at side walls of the polysilicon layer in a window of the polysilicon layer which is formed after etching the polysilicon layer;
   filling with polysilicon in a window between spacers to form a polysilicon block;
   performing chemical mechanical polishing to a top surface of the spacers and the polysilicon block to expose the spacers between the polysilicon block and the polysilicon layer;
   etching away the spacers between the polysilicon block and the polysilicon layer to expose the source regions in the well region; and
   implanting dopants of a first type into the well region under windows left after etching away the spacers to form the source regions.

9. The method of claim 8, further comprising implanting dopants of a second doping type into the well region under the window between the spacers to form a body pickup region.

10. A manufacturing process of a LDMOS device, comprising:
    forming a well region in a semiconductor substrate;
    forming a gate oxidation layer above the well region;
    depositing a polysilicon layer above the gate oxidation layer;
    sequentially forming a gate seal layer, a silicon nitride layer and a first masking layer above the polysilicon layer, wherein the first masking layer comprises at least a window to the surface of the silicon nitride layer;
    etching the silicon nitride layer, the gate seal layer and the polysilicon layer under the window of the first masking layer to expose a window for a body region in the well region;
    implanting P type dopants into the well region under the window for the body region to form the body region in the well region, and removing the first masking layer later;
    oxidizing side walls of the polysilicon layer in a window of the polysilicon layer which is formed after etching;
    forming spacers at the oxidized side walls of the polysilicon layer;
    filling the window between the spacers with polysilicon to forming a polysilicon block;
    performing chemical mechanical polishing to expose the spacers between the polysilicon block and the side walls of the polysilicon layer;
    etching away the silicon nitride layer and the spacers to expose windows for source regions;
    implanting N type dopants into the well region under the windows for source regions to forming source region;
    etching away the polysilicon block;
    forming a second masking layer above the gate seal layer, wherein the second masking layer has windows at predetermined positions;
    etching the gate seal layer and the polysilicon layer through the windows of the second masking layer to form a gate, and removing the second masking layer later;
    forming a third masking layer above the gate and the gate oxidation layer, wherein the third masking layer comprises windows for drain pickup regions; and
    implanting N type dopants into the well region under the windows of the third masking layer to form the drain pickup regions, and removing the third masking layer later.

11. The manufacturing process of claim 10, wherein the spacers are made of silicon nitride.

12. The manufacturing process of claim 10, wherein the thickness of each spacer at the side walls of the polysilicon layer is in a range of 0.1 μm~0.15 μm.

13. The manufacturing process of claim 10, wherein the width of the body region is in a range of 0.3 μm~0.5 μm.

* * * * *